United States Patent
Shindo

(10) Patent No.: US 11,776,831 B2
(45) Date of Patent: Oct. 3, 2023

(54) SUBSTRATE TRANSPORT SYSTEM AND SUBSTRATE TRANSPORT METHOD

(71) Applicant: Tokyo Electron Limited, Tokyo (JP)

(72) Inventor: Takehiro Shindo, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 186 days.

(21) Appl. No.: 17/305,545

(22) Filed: Jul. 9, 2021

(65) Prior Publication Data
US 2022/0020622 A1    Jan. 20, 2022

(30) Foreign Application Priority Data

Jul. 14, 2020 (JP) ................... 2020-120645

(51) Int. Cl.
*H01L 21/677* (2006.01)
*H01L 21/68* (2006.01)

(52) U.S. Cl.
CPC .. *H01L 21/67742* (2013.01); *H01L 21/67745* (2013.01); *H01L 21/67754* (2013.01); *H01L 21/67757* (2013.01); *H01L 21/68* (2013.01)

(58) Field of Classification Search
None
See application file for complete search history.

(56) References Cited

U.S. PATENT DOCUMENTS

| | | | |
|---|---|---|---|
| 10,155,309 B1* | 12/2018 | Blank | H01L 21/67259 |
| 2006/0163519 A1* | 7/2006 | Shindo | H01L 21/67196 |
| | | | 251/355 |
| 2006/0182529 A1* | 8/2006 | Hiroki | H01L 21/67742 |
| | | | 414/217 |
| 2006/0216137 A1* | 9/2006 | Sakata | H01L 21/67766 |
| | | | 414/222.13 |
| 2009/0321187 A1* | 12/2009 | Shindo | H01L 21/67196 |
| | | | 74/89.32 |

(Continued)

FOREIGN PATENT DOCUMENTS

| | | |
|---|---|---|
| JP | 2005-317656 A | 11/2005 |
| JP | 2013-154406 A | 8/2013 |

(Continued)

*Primary Examiner* — Kaitlin S Joerger
(74) *Attorney, Agent, or Firm* — Armstrong Teasdale LLP

(57) ABSTRACT

A substrate transport system for transporting a substrate in a vacuum atmosphere includes a vacuum chamber, inside of which is configured to be capable of being set to a vacuum atmosphere, a transport arm provided inside the vacuum chamber and configured to hold and transport the substrate, a horizontal movement mechanism configured to move the transport arm in a horizontal direction inside the vacuum chamber, a horizontal duct arm mechanism including therein an accommodation portion having a normal pressure atmosphere, the horizontal duct arm mechanism being configured to be extendable/contractible as the transport arm moves horizontally, a vertical movement mechanism configured to move the transport arm in a vertical direction inside the vacuum chamber, and a vertical duct arm mechanism including therein an accommodation portion having a normal pressure atmosphere, the vertical duct arm mechanism being configured to be extendable/contractible as the transport arm moves vertically.

12 Claims, 8 Drawing Sheets

(56) References Cited

U.S. PATENT DOCUMENTS

| | | | |
|---|---|---|---|
| 2012/0111668 A1* | 5/2012 | Shindo | H01L 21/67196 184/5 |
| 2013/0041505 A1* | 2/2013 | Cox | H01L 21/67742 901/29 |
| 2013/0053997 A1* | 2/2013 | Ohashi | H01L 21/67742 901/3 |
| 2017/0011940 A1* | 1/2017 | Shindo | H01L 21/67167 |
| 2021/0220989 A1* | 7/2021 | Shindo | F16H 25/2204 |
| 2021/0257242 A1* | 8/2021 | Yoshida | G01N 21/9501 |

FOREIGN PATENT DOCUMENTS

| | | | | |
|---|---|---|---|---|
| JP | 5893072 B | | 3/2016 | |
| JP | 2019057738 A | * | 4/2019 | ....... H01L 21/67155 |
| KR | 102203917 B1 | * | 3/2020 | ....... H01L 21/67742 |

* cited by examiner

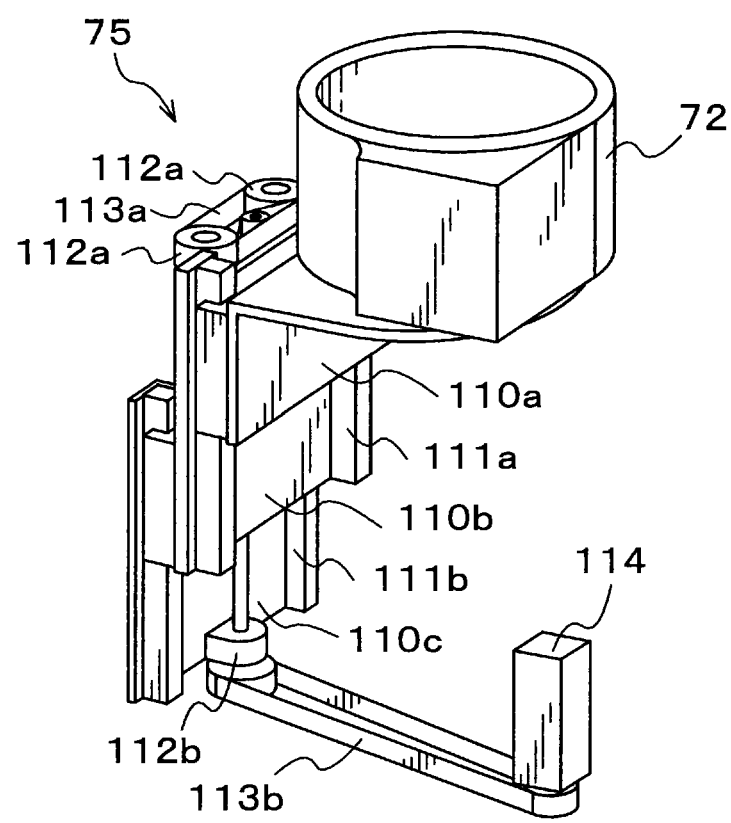

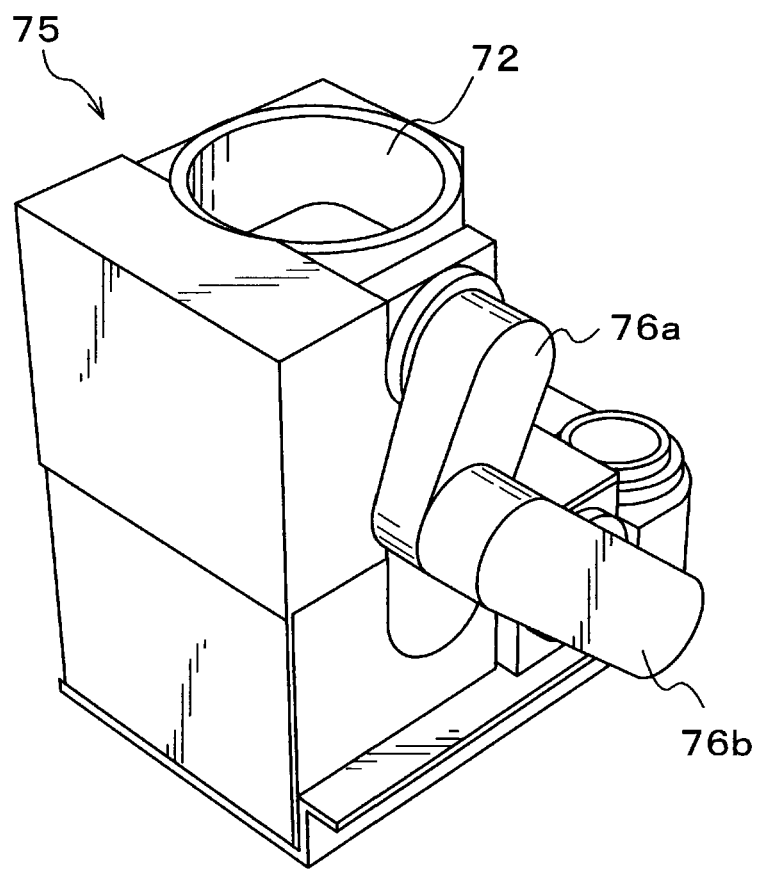

SUBSTRATE TRANSPORT SYSTEM AND SUBSTRATE TRANSPORT METHOD

CROSS-REFERENCE TO RELATED APPLICATION

This application is based upon and claims the benefit of priority from Japanese Patent Application No. 2020-120645, filed on Jul. 14, 2020, the entire contents of which are incorporated herein by reference.

TECHNICAL FIELD

The present disclosure relates to a substrate transport system and a substrate transport method.

BACKGROUND

Patent Document 1 discloses a substrate processing apparatus including a transport arm configured to transport two substrates which are mounted thereon in a vertical arrangement, and a substrate processing part configured to process the two substrates in a state in which the two substrates transported by the transport arm are arranged in a horizontal arrangement.

PRIOR ART DOCUMENT

Patent Document

Patent Document 1: Japanese Laid-Open Patent Publication No. 2013-154406

SUMMARY

According to the embodiments of the present disclosure, there is provided a substrate transport system for transporting a substrate in a vacuum atmosphere including a vacuum chamber, inside of which is configured to be capable of being set to a vacuum atmosphere, a transport arm provided inside the vacuum chamber and configured to hold and transport the substrate, a horizontal movement mechanism configured to move the transport arm in a horizontal direction inside the vacuum chamber, a horizontal duct arm mechanism including therein an accommodation portion having a normal pressure atmosphere, the horizontal duct arm mechanism being configured to be extendable/contractible as the transport arm moves horizontally, a vertical movement mechanism configured to move the transport arm in a vertical direction inside the vacuum chamber, and a vertical duct arm mechanism including therein an accommodation portion having a normal pressure atmosphere, the vertical duct arm mechanism being configured to be extendable/contractible as the transport arm moves vertically.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIGS. 5A and 5B are perspective views each illustrating an exemplary configuration of a vertical movement mechanism.

FIGS. 6A and 6B are perspective views each illustrating an exemplary configuration of a vertical duct arm.

DETAILED DESCRIPTION

Figure 1:
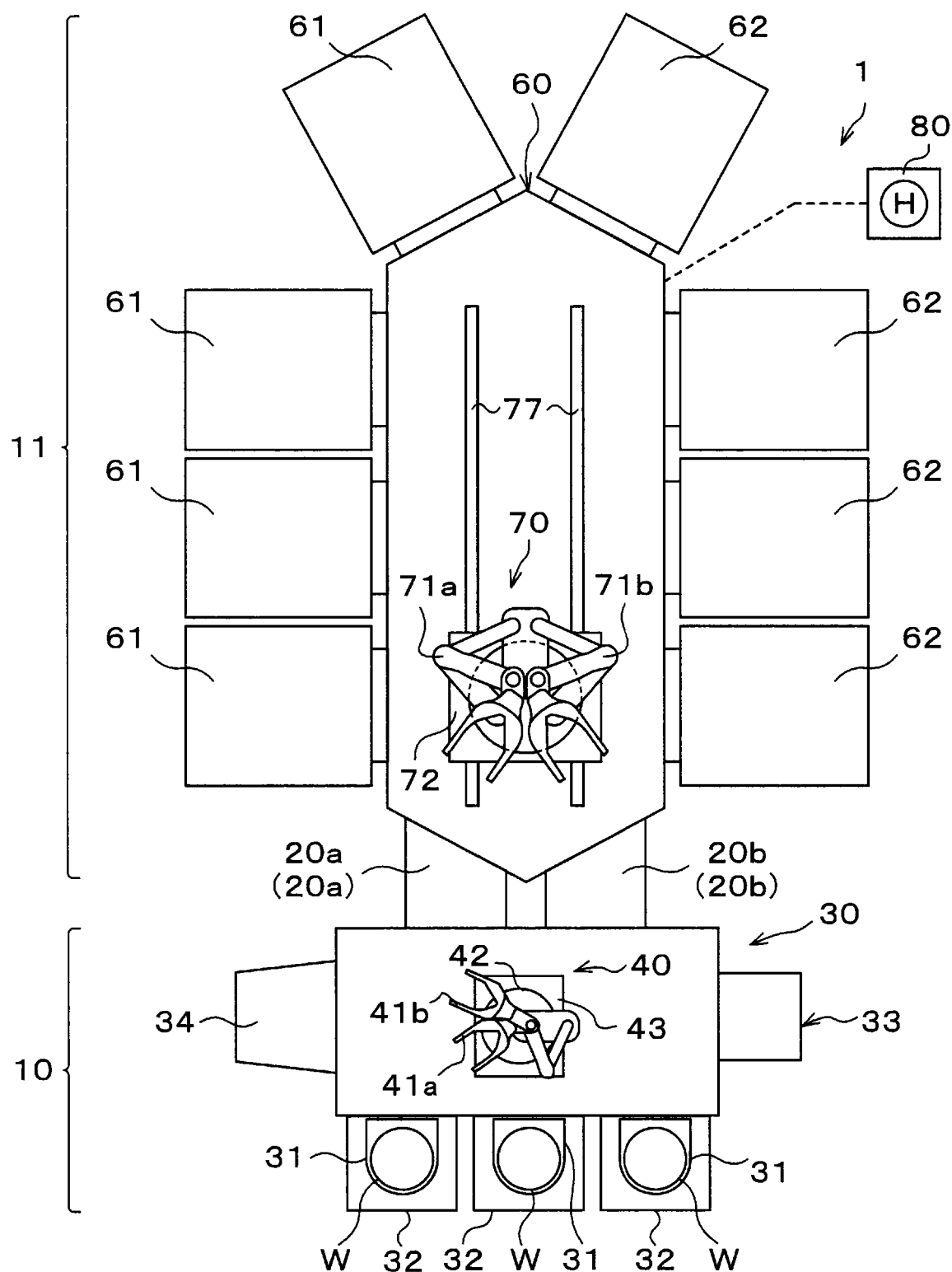
FIG. 1 is a plan view illustrating an exemplary configuration of a vacuum processing apparatus.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Conventionally, a vacuum processing apparatus transports, for example, a semiconductor wafer (a substrate (hereinafter, simply referred to as a "wafer")) in a vacuum atmosphere and performs vacuum processing such as etching processing and film formation processing. In such a vacuum processing apparatus, it is necessary to transport a wafer in a vacuum atmosphere using a transport mechanism or the like provided in a vacuum chamber.

However, in recent years, in this vacuum processing apparatus, due to miniaturization and high functionalization of the apparatus, the cases in which load-lock modules configured to deliver wafers to and from a normal pressure atmosphere and process modules configured to perform various kinds of vacuum processing on wafers are arranged in multiple stages are increasing. For this reason, it is necessary to construct a system configured to be capable of transporting a wafer held in a transport mechanism or the like in a vacuum chamber of the vacuum processing apparatus in a horizontal direction or a height direction (vertical direction).

The transport arm provided in the substrate processing apparatus described in Patent Document 1 described above transports a wafer in a vacuum atmosphere (or an atmosphere having a reduced pressure lower than the atmospheric pressure). The transport arm described in Patent Document 1 is configured to be movable in a horizontal direction along a guide rail inside a vacuum chamber (a common transport part), thereby appropriately transporting a wafer to a load-lock module or various process modules.

However, in the substrate processing apparatus described in Patent Document 1, there is no description of arranging a load-lock module LLM or the process modules PM in multiple stages with respect to the vacuum chamber (the common transport part). That is, since it is not considered that the transport arm is moved in the vertical direction inside the vacuum chamber, and thus there is room for improvement from this point of view.

The technology according to the present disclosure was developed in consideration of the above circumstances, and provides a substrate transport system capable of appropriately transporting a substrate in a vacuum atmosphere. Specifically, a substrate transport system having a degree of freedom of transporting a substrate in a horizontal direction and a vertical direction in a vacuum atmosphere, is constructed. Hereinafter, a vacuum processing apparatus provided with a transport system according to the present embodiment will be described with reference to drawings. In this specification and the drawings, elements having substantially the same functional configurations will be denoted by the same reference numerals and redundant descriptions will be omitted.

First, the configuration of a vacuum processing apparatus will be described. FIG. 1 is a plan view schematically illustrating the outline of a configuration of a vacuum processing apparatus 1. In the present embodiment, a case in which the vacuum processing apparatus 1 is provided with a chemical oxide removal (COR) module and a post heat treatment (PHT) module as process modules will be described as an example. In addition, the module configuration of the vacuum processing apparatus 1 of the present disclosure is not limited to this, and may be arbitrarily selected.

As illustrated in FIG. 1, the vacuum processing apparatus 1 includes a configuration in which an atmospheric part 10 and a reduced pressure part 11 are integrally connected via load-lock modules 20a and 20b. The atmospheric part 10 includes a plurality of atmospheric modules configured to perform respective desired processes on a wafer W under the atmospheric pressure atmosphere. The reduced pressure part 11 includes a plurality of reduced pressure modules configured to perform respective desired processes on a wafer W under a reduced pressure atmosphere.

The load-lock module 20a temporarily holds a wafer W in order to deliver the wafer W, which is transported from a loader module 30 to be described later in the atmospheric part 10, to a transfer module 60 to be described later in the reduced pressure part 11.

The load-lock module 20a is connected to a loader module 30 to be described later and a transfer module 60 to be described later via a gate (not illustrated) provided with a gate valve (not illustrated). By this gate valve, securing airtightness between the load-lock module 20a, the loader module 30, and the transfer module 60 and communication therebetween are both achieved.

A gas supply part (not illustrated) configured to supply gas and an exhaust part (not illustrated) configured to discharge gas are connected to the load-lock module 20a, and the inside of the load-lock module 20a is configured to be switchable between an atmospheric pressure atmosphere and a reduced pressure atmosphere by the gas supply part and the exhaust part. That is, the load-lock module 20a is configured to be capable of appropriately delivering a wafer W between the atmospheric part 10 having the atmospheric pressure atmosphere and the reduced pressure part 11 having the reduced pressure atmosphere.

The load-lock module 20b temporarily holds a wafer W transported from the transfer module 60 in order to hand over the wafer W to the loader module 30. The load-lock module 20b has the same configuration as the load-lock module 20a. That is, the load-lock module 20b has a gate valve (not illustrated), a gate (not illustrated), a gas supply part (not illustrated), and an exhaust part (not illustrated).

In addition, in the present embodiment, a plurality of (e.g., two in the present embodiment) load-lock modules 20a and load-lock modules 20b are each provided in multiple stages (e.g., two in the present embodiment).

The number and arrangement of load-lock modules 20a and 20b are not limited to those of the present embodiment, and may be arbitrarily set. For example, the load-lock modules 20a and 20b may not be stacked, or may be stacked and arranged in, for example, three or more stages.

The atmospheric part 10 includes a loader module 30 including a wafer transport mechanism 40, a load port 32 in which a FOUP 31 (Front Opening Unified Pod) capable of storing a plurality of wafers W is placed, a CST module 33 (Cooling Storage module) configured to cool a wafer W, and an orienter module 34 configured to adjust the horizontal orientation of a wafer W.

The loader module 30 has a rectangular housing therein, and the inside of the housing is maintained in an atmospheric pressure atmosphere. A plurality of (e.g., three) load ports 32 are arranged side by side on one side surface forming a long side of the housing of the loader module 30. The load-lock modules 20a and 20b are arranged side by side on the other side surface forming another long side of the housing of the loader module 30. The CST module 33 is provided on one side surface forming a short side of the housing of the loader module 30. The orienter module 34 is provided on the other side surface forming a short side of the housing of the loader module 30.

The number and arrangement of load ports 32, CST modules 33, and orienter modules 34 are not limited to those in the present embodiment, and may be arbitrarily designed. In addition, the types of atmospheric modules provided in the atmospheric part 10 are not limited to the present embodiment, and may be arbitrarily selected.

Each FOUP 31 accommodates a plurality of (e.g., 25) wafers W of one lot. In addition, the insides of the FOUPs 31 placed in the load ports 32 are filled with, for example, air or nitrogen gas, and are sealed.

Inside the loader module 30, a wafer transport mechanism 40 configured to transport wafers W is provided. The wafer transport mechanism 40 includes transport arms 41a and 41b configured to hold and move wafers W, a turntable 42 configured to rotatably support the transport arms 41a and 41b, and a rotary placement stage 43 on which the turntable 42 is mounted. The wafer transport mechanism 40 is configured to be movable in the longitudinal direction inside the housing of the loader module 30.

The reduced pressure part 11 includes a transfer module 60 configured to transport wafers W to various process modules, COR modules 61 each configured to perform COR processing on a wafer W, and PHT modules 62 each configured to perform PHT processing on a wafer W. The insides of the transfer module 60, the COR module 61, and the PHT module 62 are each maintained in a reduced pressure atmosphere. A plurality of (e.g., four) COR modules 61 and a plurality of (e.g., four) PHT modules 62 are provided with respect to the transfer module 60. The detailed configuration of the transfer module 60 will be described later.

In addition, the COR modules 61 and the PHT modules 62 are each connected to the transfer module 60 through a gate (not illustrated) that is provided with a gate valve (not illustrated). By this gate valve, securing airtightness between the transfer module 60, the COR modules 61, and the PHT modules 62 and communication therebetween are both achieved.

In addition, the number, arrangement, and type of process modules provided in the transfer module 60 are not limited to the present embodiment, and may be set arbitrarily. For example, a plurality of COR modules 61 and a plurality PHT modules 62 may each be provided in multiple stages.

Inside the transfer module 60, a wafer transport mechanism 70 configured to transport wafers W with respect to the COR modules 61 and the PHT modules 62 is provided. The wafer transport mechanism 70 has two transport arms 71a and 71b each configured to move in a state of holding wafers W. In addition, the detailed configuration of the wafer transport mechanism 70 will be described later.

In the transfer module 60, a wafer W held in a load lock module 20a is received by the transport arm 71a and transported to a COR module 61. In addition, the wafer W subjected to the COR processing is held by the transport arm 71a, and is transported to a PHT module 62. In addition, the wafer W subjected to the PHT processing is held by the transport arm 71b, and is carried out to a load lock module 20b.

The plasma processing apparatus 1 described above is provided with a controller 80. The controller 80 is a computer including, for example, a CPU and a memory, and includes a program storage (not illustrated). The program storage stores programs for controlling processing and transport of wafers W in the vacuum processing apparatus 1. The programs may be recorded in a non-transitory computer-readable storage medium H, and may be installed on the controller 80 from the storage medium H.

Figure 2:
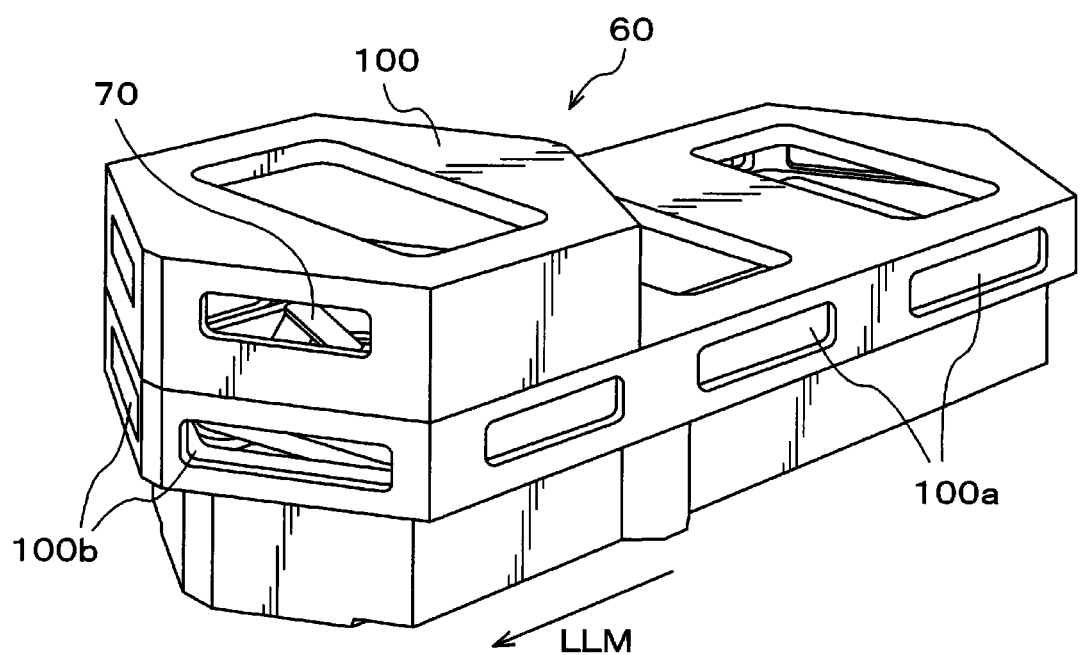
FIG. 2 is a perspective view illustrating an exemplary configuration of a transfer module.
Figure 3:
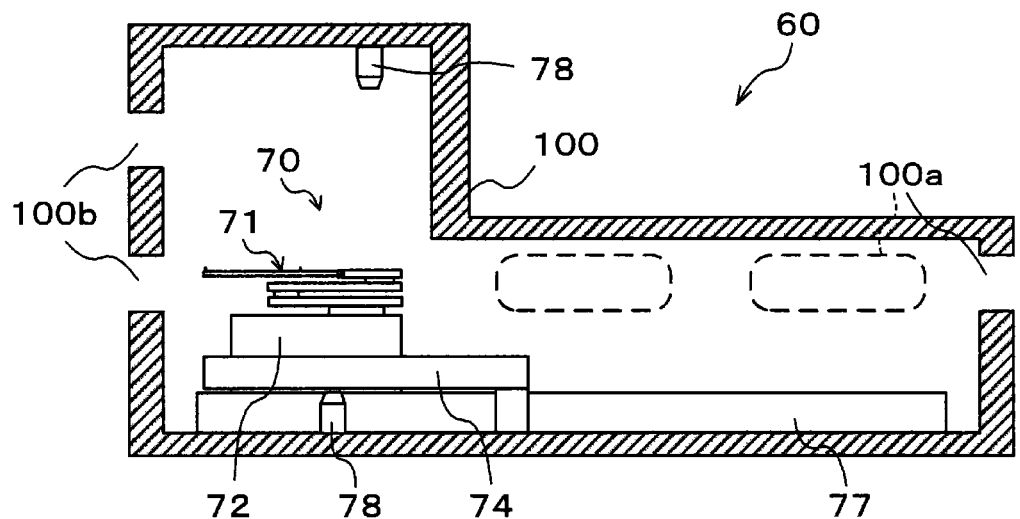
FIG. 3 is a vertical cross-sectional view illustrating an exemplary configuration of a transfer module.
Figure 4:
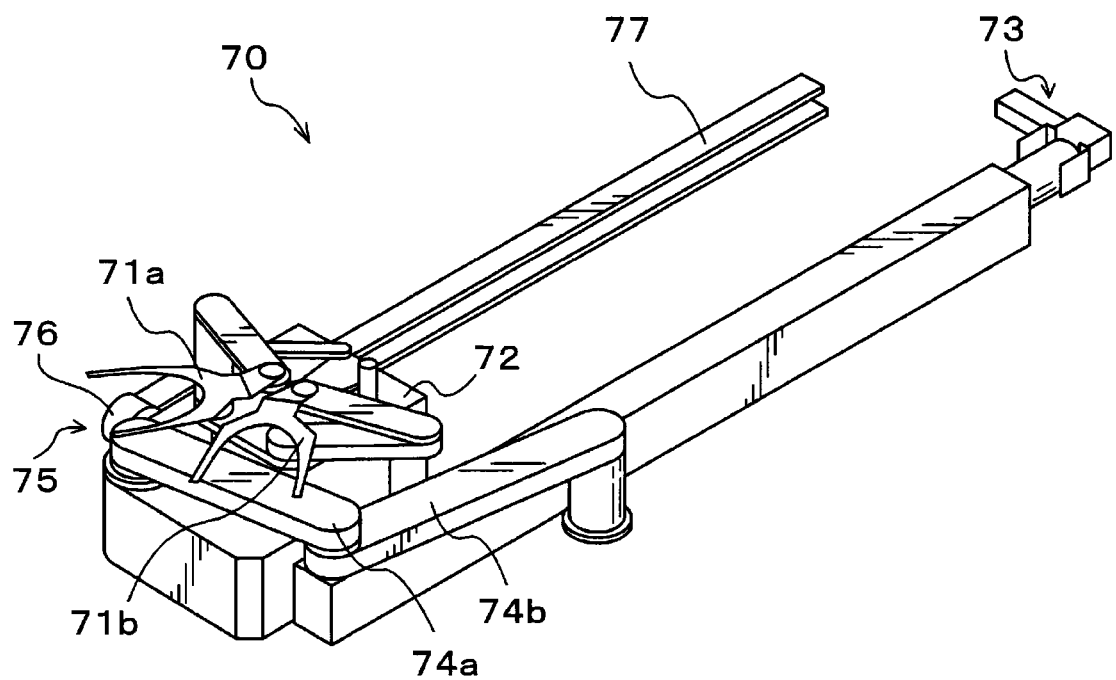
FIG. 4 is a perspective view illustrating an exemplary configuration of a wafer transport mechanism.

The vacuum processing apparatus 1 according to the present embodiment is configured as described above. Next, detailed configurations of the above-described transfer module 60 and wafer transport mechanism 70 will be described. FIGS. 2 and 3 are a perspective view and a vertical cross-sectional view each illustrating the configuration of the transfer module 60 as a substrate transport system according to the present embodiment. FIG. 4 is a perspective view illustrating the outline of the configuration of the wafer transport mechanism 70 provided inside the transfer module 60.

The transfer module 60 has a vacuum chamber 100 in which a wafer W transport space is formed. As illustrated in FIGS. 1 and 2, the vacuum chamber 100 has a substantially hexagonal shape having a pair of opposed long sides when viewed in a cross section. The side surfaces forming the long sides of the vacuum chamber 100 and the short side on the deep side (the side opposite to the load-lock modules 20a and 20b) of the vacuum chamber 100 are provided with openings 100a, through each of which wafer W delivery is performed between the vacuum chamber 100 and the above-mentioned COR modules 61 and PHT modules 62. As described above, each of the openings 100a is provided with a gate valve and a gate (not illustrated). The cross-sectional shape of the vacuum chamber 100 is not limited to the present embodiment, and may be arbitrarily determined according to the number and arrangement of load-lock modules or process modules connected to the vacuum chamber 100.

In addition, the front side (the load-lock module 20a, 20b side) of the vacuum chamber 100 is configured in multiple stages (two stages in the present embodiment), and is provided with openings 100b, through each of which wafer W delivery is performed between the vacuum chamber 100 and the above-described load-lock modules 20a and 20b. As described above, each of the openings 100b is provided with a gate valve and a gate (not illustrated).

In the transport space formed inside the vacuum chamber 100, a wafer transport mechanism 70 configured to transport wafers W in the vacuum chamber 100 is provided. As illustrated in FIG. 4, the wafer transport mechanism 70 includes two transport arms 71a and 71b each configured to move in a state of holding a wafer, and a transport base 72 configured to support the transport arms 71a and 71b. The transport arms 71a and 71b are configured to be rotatable and extendable/contractible on the transport base 72.

To the transport base 72, a horizontal movement mechanism 73, a duct arm 74 for horizontal movement, a vertical movement mechanism 75, and a duct arm 76 for vertical movement are connected. The transport base 72 is configured to be movable in the horizontal direction along the guide rail 77 extending in the longitudinal direction inside the vacuum chamber 100 by the operation of the horizontal movement mechanism 73, and configured to be vertically movable in the vertical direction with respect to the mounting surfaces of the transport arms 71a and 72b by the vertical movement mechanism 75.

The duct arm 74 as a horizontal duct arm mechanism has a first arm 74a and a second arm 74b. One end of the first arm 74a is rotatably connected to the transport base 72, and the other end is rotatably connected to one end of the second arm 74b. The one end of the second arm 74b is rotatably connected to the other end of the first arm 74a, and the other end is rotatably connected to the vacuum chamber 100. As a result, the duct arm 74 is configured to be extendable/contractible as the transport base 72 moves horizontally. In addition, FIG. 4 illustrates a state in which the transport base 72 is located on the front side of the vacuum chamber 100 (the load-lock module 20a, 20b side) and the duct arm 74 is most contracted. In addition, when the transport base 72 moves to the deep side of the vacuum chamber 100 (the side opposite to the load-lock modules 20a, 20b), the duct arm 74 is in the stretched state.

Inside the duct arm 74, a hollow portion having a normal pressure atmosphere as an accommodation portion is formed, and cables or the like are capable of being accommodated. In addition, by accommodating therein the cables or the like in the normal pressure atmosphere in this way, the duct arm 74 is capable of suppressing the contamination of the inside of the vacuum chamber 100 by gas or particles generated from the cables or the like.

The cables or the like accommodated inside the duct arm 74 include, for example, an electric cable for driving and controlling the wafer transport mechanism 70, a tube for circulating a temperature control medium for cooling the drive system of the wafer transport mechanism 70, an air supply/exhaust tube for supplying air or the like to the inside to discharge particles or the like, and the like, which connect the inside and the outside of the vacuum chamber 100. In addition, for example, inside the duct arm 74, a thermocouple for measuring the internal temperature of the vacuum chamber 100 or an accelerometer for detecting an abnormal operation of the wafer transport mechanism 70 may be provided.

Figure 5A:
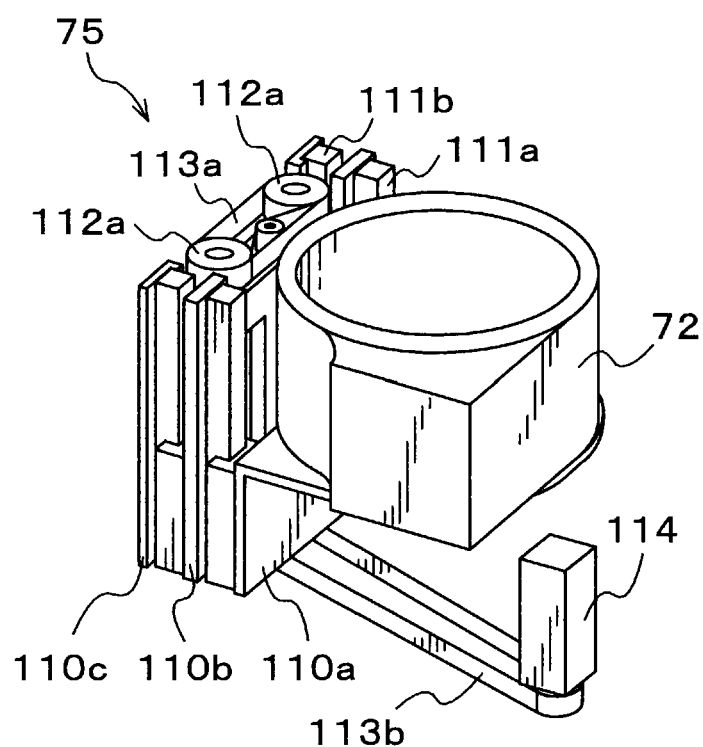

FIGS. 5A and 5B are perspective views each schematically illustrating the outline of the configuration of the vertical movement mechanism 75, in which FIG. 5A illustrates a state in which the transport base 72 is located at the lowermost stage and FIG. 5B illustrates a state in which the transport base 72 is raised to the uppermost stage by the vertical movement mechanism 75. As illustrated in FIGS. 5A and 5B, the vertical movement mechanism 75 has a telescopic structure in which a plurality of panels (three panels such as a first panel 110a, a second panel 110b, and a third panel 110c in the present embodiment) are provided to be stacked in a horizontal direction. The first panel 110a is configured be raised and lowered with respect to the second panel 110b along a pair of guides 111a, and includes the transport base 72 on the top surface thereof. The second panel 110b is configured to be capable of being raised and lowered with respect to the third panel 110c along a pair of guides 111b. The third panel 110c is connected to, for example, a guide rail 77, whereby the transport base 72 is configured to be horizontally movable inside the vacuum chamber 100, together with the vertical movement mechanism 75.

In addition, the vertical movement mechanism 75 includes two ball screws 112*a* and a drive belt 113*a* configured to raise and lower the first panel 110*a* with respect to the second panel 110*b*, a ball screw 112*b* and a drive belt 113*b* configured to raise and lower the second panel 110*b* with respect to the third panel 110*c*, and a drive motor 114 configured to drive the vertical movement mechanism 75. In the vertical movement mechanism 75, by operating the drive motor 114, the ball screw 112*b* is rotated via the drive belt 113*b* to raise and lower the second panel 110*b*, and the rotation of the ball screw 112*b* is transmitted to the ball screw 112*a* via the drive belt 113*a* so as to raise and lower the first panel 110*a*.

Figure 6A:
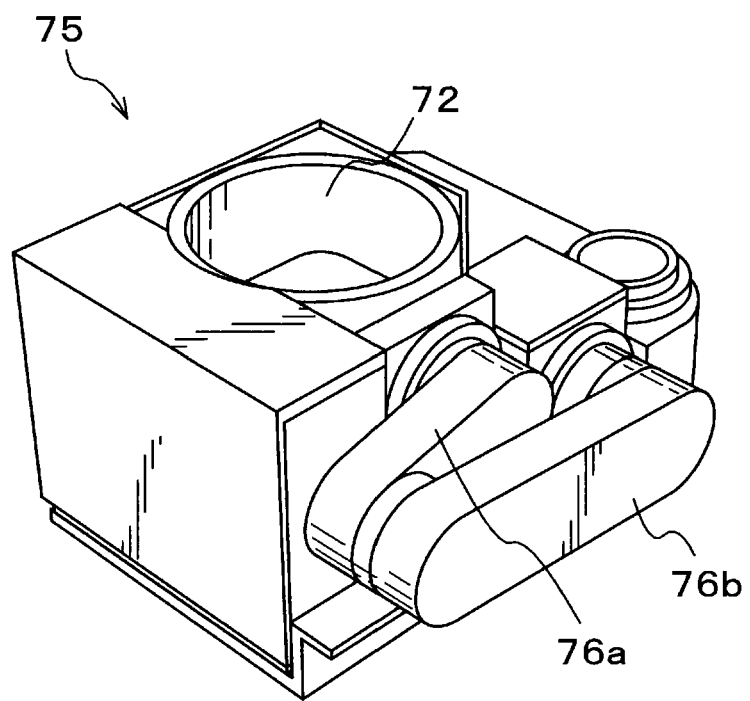

As illustrated in FIGS. 6A and 6B, the duct arm 76 as a vertical duct arm mechanism has a first arm 76*a* and a second arm 76*b*. One end of the first arm 76*a* is rotatably connected to the transport base 72, and the other end is rotatably connected to one end of the second arm 76*b*. The one end of the second arm 76*b* is rotatably connected to the other end of the first arm 76*a*, and the other end is rotatably connected to, for example, the third panel 110*c*. As a result, the duct arm 76 is configured to be extendable/contractible as the transport base 72 moves vertically. FIG. 6A illustrates the duct arm 76 in a state in which the transport base 72 is located at the lowermost stage, and FIG. 6B illustrates the duct arm 76 in a state in which the transport base 72 is raised to the uppermost stage by the vertical movement mechanism 75.

Inside the duct arm 76, a hollow portion having a normal pressure atmosphere as an accommodation portion is formed like the duct arm 74, and cables or the like are capable of being accommodated.

On the ceiling surface and/or the bottom surface of the vacuum chamber 100 which is configured in multiple stages on the front side (the load-lock module 20*a*, 20*b* side), a calibration sensor 78 is provided as a first detection mechanism for detecting the positions of the transport arms 71*a* and 71*b* and wafers W held by the transport arms 71*a* and 71*b*.

As will be described later, the calibration sensor 78 detects the relative positions (in the horizontal and vertical directions) of the wafers W and the transport arms 71*a* and 71*b* inside the vacuum chamber 100 by a sensor optical axis (see the optical axis X in FIG. 7). Specifically, the relative positions of the wafers W and the transport arms 71*a* and 71*b* are detected by detecting the timing at which the light shielding and the light transmission of the sensor optical axis are switched due to the passage of the wafers W and the transport arms 71*a* and 71*b*. The number and arrangement of calibration sensors 78 may be arbitrarily designed.

The transfer module 60 and the wafer transport mechanism 70 according to the present embodiment are configured as described above, but the configurations of the transfer module 60 and the wafer transport mechanism 70 are not limited thereto.

For example, in the present embodiment, the vertical movement mechanism 75 of the wafer transport mechanism 70 is configured by a telescopic structure in which a plurality of panels 110 are stacked in the horizontal direction, but the wafer transport mechanism 70 may be arbitrarily designed as long as the transport arm 71 is capable of being moved vertically in the state of holding a wafer W. In addition, by configuring the vertical movement mechanism 75 to be extendable/contractible in the vertical direction as in the present embodiment, it is possible to compactly configure the vertical movement mechanism 75 without increasing the size in the vertical direction.

According to the present embodiment, the transport arms 71*a* and 71*b* each configured to hold a wafer W are configured to be rotatable and extendable/contractible with respect to the transport base 72, and the transport base 72 is configured to be movable in the horizontal and vertical directions inside the vacuum chamber 100. Therefore, it is possible to appropriately transport the wafers W held by the transport arms 71*a* and 71*b* to any load-lock modules 20*a* and 20*b*, a COR module 61 or a PHT module 62. In other words, even when the load-lock modules and the process modules are stacked in multiple stages, it is possible to appropriately transport a wafer W to any module.

In the present embodiment, the vertical movement mechanism 75 of the wafer transport mechanism 70 has a telescopic structure that is extendable/contractible in the vertical direction, and when the transport base 72 is not raised, a plurality of panels are stacked in the horizontal direction and received, as illustrated in FIG. 5A. As a result, it is possible to suppress the increase the size of the vertical movement mechanism 75 provided inside the vacuum chamber 100. That is, it is possible to omit an installation space for the wafer transport mechanism 70.

Figure 7:
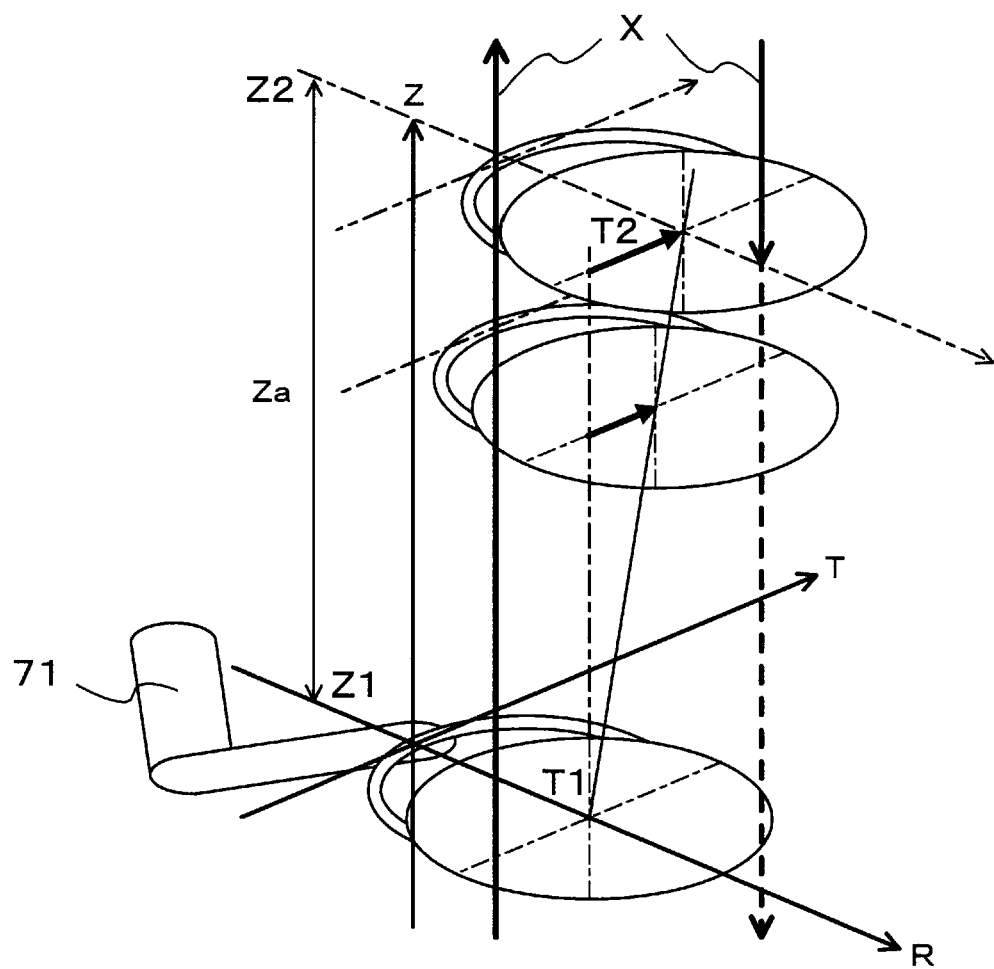
FIG. 7 is an explanatory view illustrating a state of positional deviation occurring on a wafer.

Here, when a wafer W held by the wafer transport mechanism 70 is vertically moved as in the present embodiment, as illustrated in FIG. 7, a deviation of the horizontal position of the wafer W (e.g., the direction T in FIG. 7) may occur due to the vertical movement. In addition, when a positional deviation occurs in the wafer W in the horizontal direction in this way, it is impossible to appropriately recognize the position of the wafer W (the transport arms 71*a* and 71*b*) inside the vacuum chamber 100, and the wafer W may not be appropriately transported to various modules. Furthermore, it is considered that the positional deviation amount in the horizontal direction increases when the amount of movement in the vertical direction increases, that is, when the stacked number of various modules configured in multiple stages increases, and the wafer W may not be appropriately transported.

It is possible to eliminate the horizontal positional deviation due to the vertical movement of the wafer W by, for example, calibrating the horizontal position of the wafer W for each transport height (in the present embodiment, for example, the height of each of the load-lock modules 20*a* and 20*b* arranged in multiple stages). That is, it is possible to appropriately transport a wafer W to various modules by detecting a positional deviation amount at each transport height position using, for example, the calibration sensor 78 and storing the positional deviation amount at each height position in the controller 80 as calibration data.

However, when detecting the positional deviation amount at each transport height position in this way, the adjustment time for acquiring calibration data at each height position increases when various modules are further stacked in three or more stages.

Therefore, the vacuum processing apparatus 1 according to the present embodiment detects the positional deviation amounts T1 and T2 in the horizontal direction at the height positions Z1 and Z2 of any two different points in the vertical movable range of the wafer transport mechanism 70 (the range Za in FIG. 7) (preferably, the lowermost and uppermost stages in the movable range as illustrated in FIG. 7) prior to the transport of a wafer W in the transfer module 60. In this case, the wafer W may or may not be held by the transport arms 71*a* and 71*b*. In addition, for example, a dummy wafer for position calibration may be held. The detected positional deviation amounts T1 and T2 are output to the controller 80.

In detecting the positional deviation amounts T1 and T2, in order to prevent the relative position of the held wafer W to the transport arms 71a and 71b from changing, the wafer W or the dummy wafer are not replaced. That is, the pure positional deviation amount of the wafer W in the horizontal direction due to the vertical movement of the wafer transport mechanism 70 is detected.

Next, based on the difference in the detected positional deviation amounts (T2−T1) and the difference in the height positions of the two points at which the positional deviation amounts are detected (Z2−Z1), the positional deviation amount in the horizontal direction per unit height, namely, the correlation between the height position and the positional deviation amount in the horizontal direction is calculated. The calculated correlation is output to the controller 80. The method of calculating the correlation between the height position and the positional deviation amount in the horizontal direction is not particularly limited. For example, the relationship between the height position and the positional deviation amount may be linearly approximated or may be non-linearly approximated.

In addition, in transferring a wafer W in the transfer module 60, the vacuum processing apparatus 1 according to the present embodiment corrects the horizontal position information of the transport arms 71a and 71b with respect to the height positions of the transport arms 71a and 71b based on the correlation between the height position and the positional deviation amount in the horizontal direction calculated in advance as described above. As a result, it is possible to appropriately transport a wafer W even when various modules are stacked and connected to the transfer module 60.

In addition, the calculation of the correlation between the height position of a wafer W and the positional deviation amount in the horizontal direction is performed, for example, when the vacuum processing apparatus 1 is started up or when there is a possibility that the holding position of the wafer W with respect to the transport arm 71 may change due to maintenance of the transfer module 60 or the like.

In calibrating the positional deviation amount of a wafer W according to the present embodiment, the positional deviation amount is detected only at the height positions of two arbitrarily different points, as described above. Then, the correlation is calculated based on the difference between the height positions of the two points and the detected positional deviation amount, and the position calibration of the wafer W is performed based on the calculated correlation. Therefore, even when the load-lock modules and the process modules stacked in three or more stages are connected to the transfer module 60, it is not necessary to increase the number of calibrations for the positional deviation amount of a wafer W (detection of the position of the wafer W and correction of the horizontal position by the calibration sensor 78). That is, it is possible to suppress an increase in the adjustment time for acquiring calibration data.

In the embodiment described above, the correlation between the height position of the wafer W and the positional deviation amount is calculated through an arbitrary method such as linear approximation or non-linear approximation. However, it is considered that a primary (linear) change of the positional deviation amount in the horizontal direction with respect to the height direction, such as the inclination of the guide 111 for sliding the panel 110 or the inclination of the optical axis of a laser emitted from the calibration sensor 78 mainly occurs as the positional deviation of a wafer W in the horizontal direction detected in the transfer module 60. Therefore, in the present embodiment, it is possible to further appropriately shorten the adjustment time for acquiring calibration data by simply calculating the correlation between the height position of a wafer W and the positional deviation amount through linear approximation.

In the wafer transport mechanism 70 according to the present embodiment, as illustrated in FIGS. 5A and 5B, when the transport base 72 is cantilevered with respect to the vertical movement mechanism 75 and the height position of the transport arm 71 is located at the uppermost stage, the wafer transport mechanism 70 may be tilted toward the center of gravity thereof. However, in the transfer module 60 according to the present embodiment, even when the wafer transport mechanism 70 is tilted toward the center of gravity in this way, it is possible to correct the position information of a wafer W based on the correlation between the height position of the wafer W and the positional deviation amount calculated through the method described above.

In addition, a thermal expansion/contraction detection sensor (not illustrated) may be further provided inside the vacuum chamber 100 as a second detection mechanism for detecting the amount of expansion/contraction of the ball screw 112 in the vertical direction.

Specifically, the ball screw 112 is made of a material having a coefficient of thermal expansion different from that of, for example, the panel 110 or the guide 111, and the difference in the coefficient of thermal expansion may cause a positional deviation in a direction perpendicular to the transport arm 71 or a wafer W. Therefore, the positional deviation in the vertical direction may be detected using the thermal expansion/contraction detection sensor, and the positional deviation of the wafer W relative to the vertical direction may be further corrected based on the detection.

Furthermore, a thermal expansion/contraction detection sensor (not illustrated) may be further provided inside the vacuum chamber 100 to detect the positional deviation amount of the wafer W due to thermal expansion/contraction of the horizontal movement mechanism 73.

In addition, in the vertical movement mechanism 75, the positional deviation in the vertical direction may occur in the transport arm 71 or the wafer W due to a change over time in apparatus characteristics such as elongation due to, for example, deterioration of the drive belt 113. In the present embodiment, even when the positional deviation in the vertical direction occurs due to a change over time in apparatus characteristics, it is possible to correct the positional deviation using the thermal expansion/contraction detection sensor.

It should be understood that the embodiments disclosed herein are illustrative and are not limiting in all aspects. The embodiments described above may be omitted, replaced, or modified in various forms without departing from the scope and spirit of the appended claims.

According to the present disclosure, a substrate transport system capable of appropriately transporting a substrate in a vacuum atmosphere is provided.

While certain embodiments have been described, these embodiments have been presented by way of example only, and are not intended to limit the scope of the disclosures. Indeed, the embodiments described herein may be embodied in a variety of other forms. Furthermore, various omissions, substitutions, and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate transport system for transporting a substrate in a vacuum atmosphere, the substrate transport system comprising:
a vacuum chamber, inside of which is configured to be capable of being set to a vacuum atmosphere;
a transport arm provided inside the vacuum chamber and configured to hold and transport the substrate;
a horizontal movement mechanism configured to move the transport arm in a horizontal direction inside the vacuum chamber;
a horizontal duct arm mechanism including therein an accommodation portion having a normal pressure atmosphere, the horizontal duct arm mechanism being configured to be extendable/contractible as the transport arm moves horizontally;
a vertical movement mechanism configured to move the transport arm in a vertical direction inside the vacuum chamber;
a vertical duct arm mechanism including therein an accommodation portion having a normal pressure atmosphere, the vertical duct arm mechanism being configured to be extendable/contractible as the transport arm moves vertically;
a first detection mechanism provided in the vacuum chamber and configured to detect a positional deviation amount of the transport arm in the horizontal direction due to a vertical movement of the transport arm; and
a controller configured to control the movement of the transport arm,
wherein the controller is configured to:
detect the positional deviation amount at height positions of two different points of the transport arm;
calculate a correlation between a height position and the positional deviation amount of the transport arm in the horizontal direction based on a difference between the height positions of the two points and the detected positional deviation amount and
correct the position of the transport arm in the horizontal direction with respect to the height position of the transport arm based on the correlation calculated in advance to transport the substrate by the transport arm.

2. The substrate transport system of claim 1, wherein the height positions of the two points for detecting the positional deviation amount are uppermost and lowermost stages of a movement range of the transport arm in the vertical direction.

3. The substrate transport system of claim 2, wherein the vertical movement mechanism is configured to extendable/contractible in the vertical direction inside the vacuum chamber.

4. The substrate transport system of claim 3, wherein the vertical movement mechanism includes a plurality of guides, a plurality of ball screws, and a plurality of belts, and has a telescopic structure in which sliding movements occur in the vertical direction.

5. The substrate transport system of claim 4, further comprising:
a second detection mechanism provided in the vacuum chamber and configured to detect a positional deviation amount of the transport arm in the vertical direction due to a change in thermal expansion/contraction of the vertical movement mechanism or a change in an apparatus characteristic.

6. The substrate transport system of claim 5, wherein at least one of an electric cable, an air supply/exhaust tube, a temperature control medium circulation tube, a thermocouple, and an accelerometer is accommodated inside the accommodation portion in the horizontal duct arm mechanism and the vertical duct arm mechanism.

7. The substrate transport system of claim 1, wherein the vertical movement mechanism is configured to extendable/contractible in the vertical direction inside the vacuum chamber.

8. The substrate transport system of claim 1, further comprising:
a second detection mechanism provided in the vacuum chamber and configured to detect a positional deviation amount of the transport arm in the vertical direction due to a change in thermal expansion/contraction of the vertical movement mechanism or a change in an apparatus characteristic.

9. The substrate transport system of claim 1, wherein at least one of an electric cable, an air supply/exhaust tube, a temperature control medium circulation tube, a thermocouple, and an accelerometer is accommodated inside the accommodation portion in the horizontal duct arm mechanism and the vertical duct arm mechanism.

10. A method of transporting a substrate in a vacuum atmosphere, wherein a transport arm that transports the substrate is configured to be movable in a vertical direction inside a vacuum chamber, the method comprising:
detecting positional deviation amounts of the transport arm in a horizontal direction at height positions of two different points;
calculating a correlation between the height position and the positional deviation amount of the transport arm in the horizontal direction based on a difference between the height positions of the two points and the detected positional deviation amount; and
transporting the substrate using the transport arm,
wherein in the transporting the substrate using the transport arm, the position of the transport arm in the horizontal direction is corrected according to the height position of the transport arm, based on the correlation calculated in advance in the calculating a correlation between the height position and the positional deviation amount of the transport arm in the horizontal direction.

11. The method of claim 10, wherein the height positions of the two points for detecting the positional deviation amount are uppermost and lowermost stages of a movement range of the transport arm in the vertical direction.

12. The method of claim 10, wherein the detecting a positional deviation amount of the transport arm in a horizontal direction at height positions of two different points is performed in a state in which the substrate is held by the transport arm, and
in the detecting a positional deviation amount of the transport arm in a horizontal direction at height positions of two different points, the substrate held by the transport arm is not replaced.

* * * * *